United States Patent
Sohn

(10) Patent No.: US 6,881,987 B2
(45) Date of Patent: Apr. 19, 2005

(54) PMOS DEVICE HAVING ULTRA SHALLOW SUPER-STEEP-RETROGRADE EPI-CHANNEL WITH DUAL CHANNEL DOPING AND METHOD FOR FABRICATING THE SAME

(75) Inventor: Yong-Sun Sohn, Ichon-shi (KR)

(73) Assignee: Hynix Semiconductor Inc., Kyoungki-Do (KR)

(*) Notice: Subject to any disclaimer, the term of this patent is extended or adjusted under 35 U.S.C. 154(b) by 56 days.

(21) Appl. No.: 10/616,625

(22) Filed: Jul. 10, 2003

(65) Prior Publication Data

US 2004/0126947 A1 Jul. 1, 2004

(30) Foreign Application Priority Data

Dec. 30, 2002 (KR) .................. 10-2002-0086275

(51) Int. Cl.[7] ................ H01L 31/0328; H01L 31/0336; H01L 31/072; H01L 31/109; H01L 21/336
(52) U.S. Cl. .................. 257/192; 257/262; 257/288; 257/327; 257/335; 257/369; 438/197; 438/368
(58) Field of Search ................. 257/192, 262, 257/288, 327, 335, 369; 438/197, 368

(56) References Cited

U.S. PATENT DOCUMENTS 5,786,620 A 7/1998 Richards, Jr. et al.
5,917,219 A 6/1999 Nandakumar et al.
6,365,475 B1 4/2002 Cheng et al.
6,686,630 B1 * 2/2004 Hanafi et al. ............... 257/366

\* cited by examiner

Primary Examiner—David E. Graybill
(74) Attorney, Agent, or Firm—Marshall, Gerstein & Borun LLP

(57) ABSTRACT

The present invention provides a p-channel metal-oxide-semiconductor (pMOS) device having an ultra shallow epi-channel satisfying a high doping concentration required for a device of which gate length is about 30 nm even without using a HALO doping layer and a method for fabricating the same. The pMOS device includes: a semiconductor substrate; a channel doping layer being formed in a surface of the semiconductor substrate and being dually doped with dopants having different diffusion rates; a silicon epi-layer being formed on the channel doping layer, whereby constructing an epi-channel along with the channel doping layer; a gate insulating layer formed on the silicon epi-layer; a gate electrode formed on the gate insulating layer; a source/drain extension region highly concentrated and formed in the semiconductor substrate of lateral sides of the epi-channel; and a source/drain region electrically connected to the source/drain extension region and deeper than the source/drain region.

18 Claims, 10 Drawing Sheets

PMOS DEVICE HAVING ULTRA SHALLOW SUPER-STEEP-RETROGRADE EPI-CHANNEL WITH DUAL CHANNEL DOPING AND METHOD FOR FABRICATING THE SAME

RELATED APPLICATION DATA

This application claims the benefit of foreign priority under 35 U.S.C. §119 of Korean patent application number 2002-0086275 filed Dec. 30, 2002.

1. Field of the Invention

The present invention relates to a method for fabricating a p-channel metal-oxide semiconductor (pMOS) device; and, more particularly, to a p-channel metal-oxide-semiconductor field effect transistor (pMOSFET) having an ultra shallow super-steep-retrograde epi-channel of which gate length is below 100 nm and a method for fabricating the same.

2. Description of Related Arts

Generally, in a metal-oxide-semiconductor field effect transistor (MOSFET) or a metal-insulator-semiconductor field effect transistor (MISFET), a surface region of a semiconductor substrate below a gate electrode and a gate oxide layer acts to flow currents by using an electric field supplied to a source/drain in a state that voltage is supplied to the gate electrode, and this surface region is called channel.

Also, properties of the aforementioned transistors are determined by a dopant concentration of the channel. In particular, it is very important to dope the channel precisely since such basic characteristics of the channel such as threshold voltage ($V_T$), drain current ($I_d$) and so forth are determined by the dopant concentration.

Among various types of channel doping methods, a well ion implantation according to an ion implantation method and a channel ion implantation (or a threshold ion implantation) are most widely used. With use of the above implantation methods, there are various types of channel structures including a flat channel type having consistent concentrations throughout the channel, a buried channel type wherein a channel is formed at a specific depth and a retrograde channel type having a low concentration at its surface but a higher concentration as moving in a direction of depth.

The retrograde channel formed by a heavy ion implantation method using In, As and Sb is generally used for a channel structure of a high performance microprocessor having a gate length below about 0.2 $\mu$m. Since the retrograde channel shows an effect of increasing surface mobility of carriers due to its low concentration at a surface, it can be applied to a high performance device having high driving current characteristics.

However, as a channel length decreases, a channel depth is required to be shallow. Thus, a typical ion implantation method has a limitation in realization of a retrograde channel of which channel depth is below about 50 nm.

To satisfy the demand for realizing the retrograde channel, an epi-channel structure having an epitaxial layer formed on a channel doping layer had been suggested.

FIG. 1 is a diagram showing a conventional semiconductor device with an epi-channel structure.

As shown, a gate oxide layer 12 and a gate electrode 13 are formed on a semiconductor substrate 11, and an epi-channel including an epitaxial layer 14 and a channel doping layer 15 is formed in the semiconductor substrate 11 beneath the gate oxide layer 12. A highly concentrated source/drain extension (SDE) region 16 is formed at both lateral sides of the epi-channel, and a HALO doping layer 17 contacted to a bottom part of the SDE region 16 is formed. Herein, the HALO doping layer 17 simultaneously functions as a punch stop doping layer. After forming the HALO doping layer 17, a spacer 19 is formed at both lateral sides of the gate electrode 13. Then, source/drain regions 18 neighbored to both sides of the SDE region 16 and the HALO doping layer 17 are formed.

However, when forming the channel doping layer 15 according to the prior art described above, only one type of ions are doped thereto. Therefore, it is impossible to overcome a limitation in a doping profile as illustrated in FIGS. 2A and 2B.

FIG. 2A is a graph showing a doping profile when using an ion type of $_{31}P$ having a higher diffusion rate. Because of a rapid diffusion during a subsequent thermal process, it is limited to form a super steep retrograde (SSR) doping profile providing a desired degree of difference in concentration. That is, it is difficult to make the concentration difference between a maximum concentration (Cmax) of the epi-channel and a concentration of a silicon surface (Cs) above 30 times. It is also difficult to provide the Cmax of the epi-channel above $3 \times 10^{18}$ atoms/cm$^3$. These facts result in a further disadvantage of forming the epi-channel able to prevent a short channel phenomenon in a MOSFET device of which gate length is less than 70 nm. Although it is necessary to additionally form the HALO doping layer 15, a HALO ion implantation method cannot be used because of an increase in gate height as such design rule allowing minimization of a device is adopted and a subsequent sharp increase in aspect ratio.

FIG. 2B is a graph showing a doping profile in case of using an ion type of $_{75}As$ or Sb having a low diffusion rate. It is possible to perform easily a high concentration channel doping that provides the Cmax of about $1.0 \times 10^{19}$ atoms/cm$^3$ required for a device having a gate length about 30 nm. Despite of this advantage, a dopant concentration of an epi-channel is too low due to a low diffusion rate of the dopant, further resulting in a low threshold voltage and a subsequent problem of excessive sub-threshold leakages at below the threshold voltage.

SUMMARY OF THE INVENTION

It is, therefore, an object of the present invention to provide a p-channel-metal-oxide-semiconductor (pMOS) device having an ultra shallow super-steep-retrograde epi-channel satisfying a high doping concentration required for a device of which gate length is about 30 nm even without using a HALO doping layer and a method for fabricating the same.

In accordance with an aspect of the present invention, there is provided a p-channel-metal-oxide-semiconductor (pMOS) device, including: a semiconductor substrate; a channel doping layer being formed in a surface of the semiconductor substrate and being dually doped with dopants having different diffusion rates; a silicon epi-layer being formed on the channel doping layer, whereby constructing an epi-channel along with the channel doping layer; a gate insulating layer formed on the silicon epi-layer; a gate electrode formed on the gate insulating layer; a source/drain extension region highly concentrated and formed in the semiconductor substrate of both lateral sides of the epi-channel; and a source/drain region electrically connected to the source/drain extension region and deeper than the source/drain region.

In accordance with another aspect of the present invention, there is also provided a method for forming an epi-channel of a p-channel metal-oxide-semiconductor (pMOS), including the steps of: forming a channel doping layer beneath a surface of a semiconductor substrate through a dual doping of dopants having different diffusion rates; performing an annealing process for activating the dopants ion-implanted into the channel doping layer; performing a surface treatment for removing a native oxide layer formed on a surface of the channel doping layer; and growing a silicon epi-layer on the channel doping layer through a selective epitaxial growth.

In accordance with still another aspect of the present invention, there is also provided a method for fabricating a pMOS device, including the steps of: forming an n-type channel doping layer beneath a surface of a semiconductor substrate through a dual doping of dopants having different diffusion rates; performing a surface treatment for removing a native oxide layer formed on a surface of the n-type channel doping layer; growing a silicon epi-layer on the n-type channel doping layer through a selective epitaxial growth; forming sequentially a gate insulating layer and a gate electrode on a predetermined region of the silicon epi-layer through deposition and patterning processes; forming a highly concentrated p-type source/drain extension region in a predetermined portion of the semiconductor substrate beneath lateral sides of the gate electrode; forming a spacer at lateral sides of the gate electrode; and forming a highly concentrated p-type source/drain region electrically connected to the source/drain extension region.

BRIEF DESCRIPTION OF THE DRAWINGS(S)

The above and other objects and features of the present invention will become apparent from the following description of the preferred embodiments given in conjunction with the accompanying drawings, in which.

DETAILED DESCRIPTION OF THE INVENTION

Figure 1:
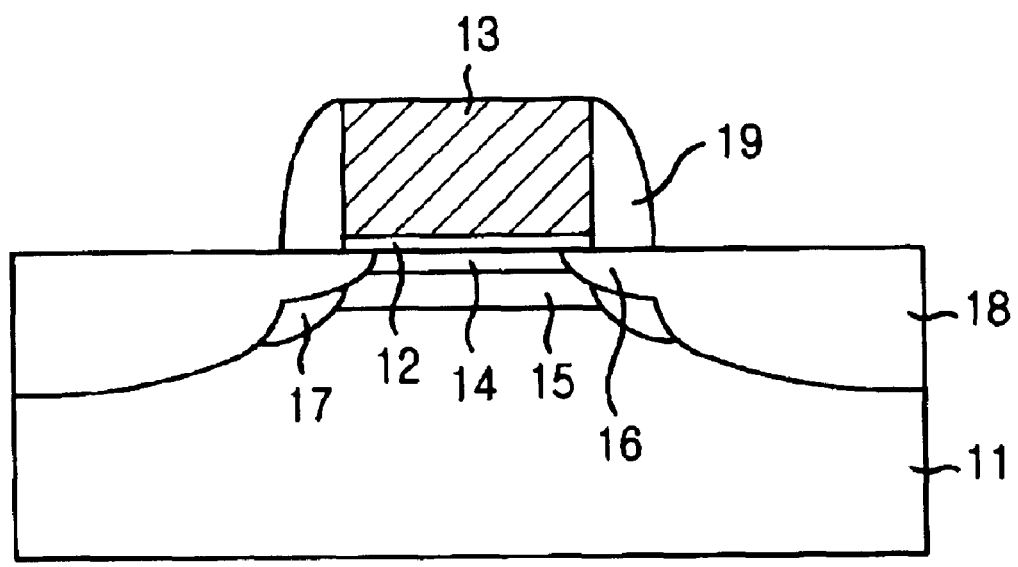
FIG. 1 is a diagram showing a conventional semiconductor device having an epi-channel.
Figure 2A:
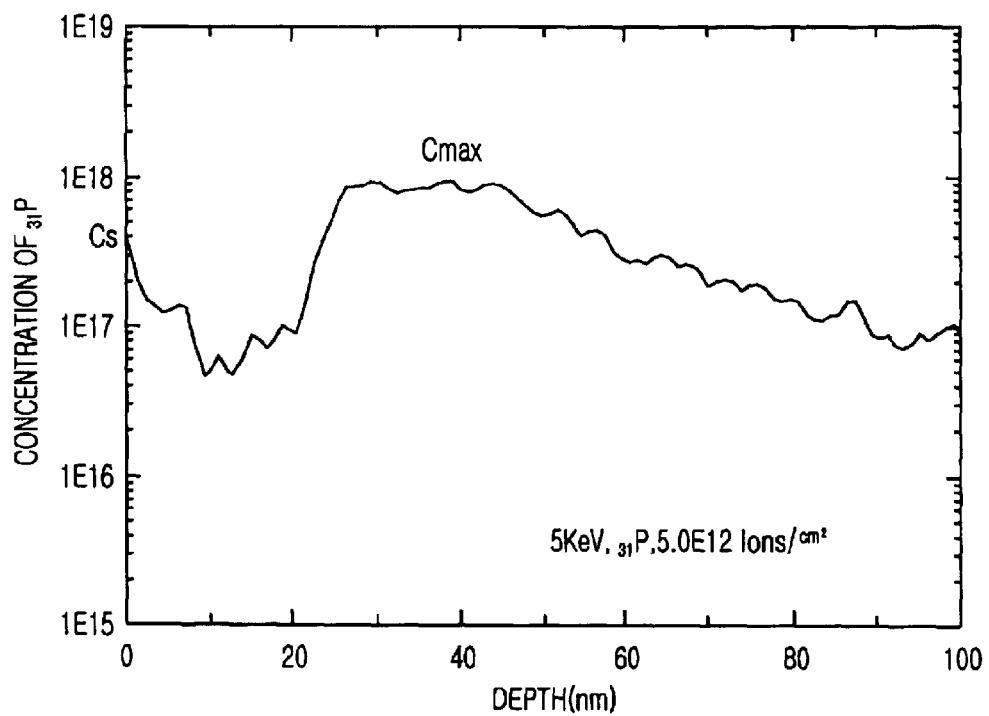
FIG. 2A is a graph showing a doping profile using an ion type of $_{31}P$ having a high diffusion rate.
Figure 2B:
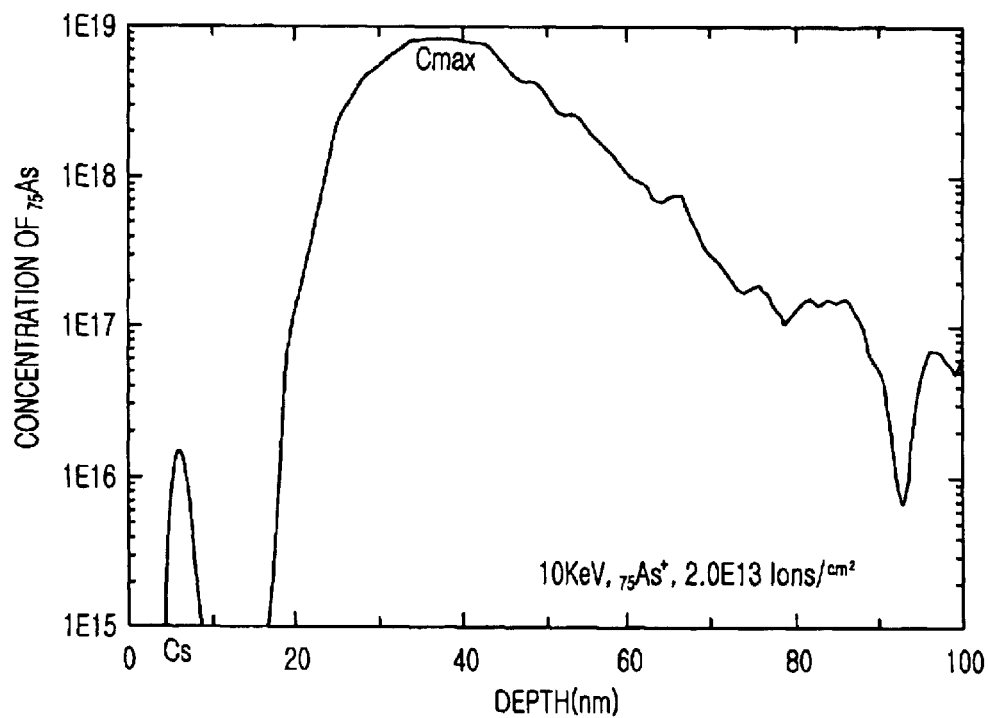
FIG. 2B is a graph showing a doping profile using an ion type of $_{75}As$ or Sb having a low diffusion rate.
Figure 3:
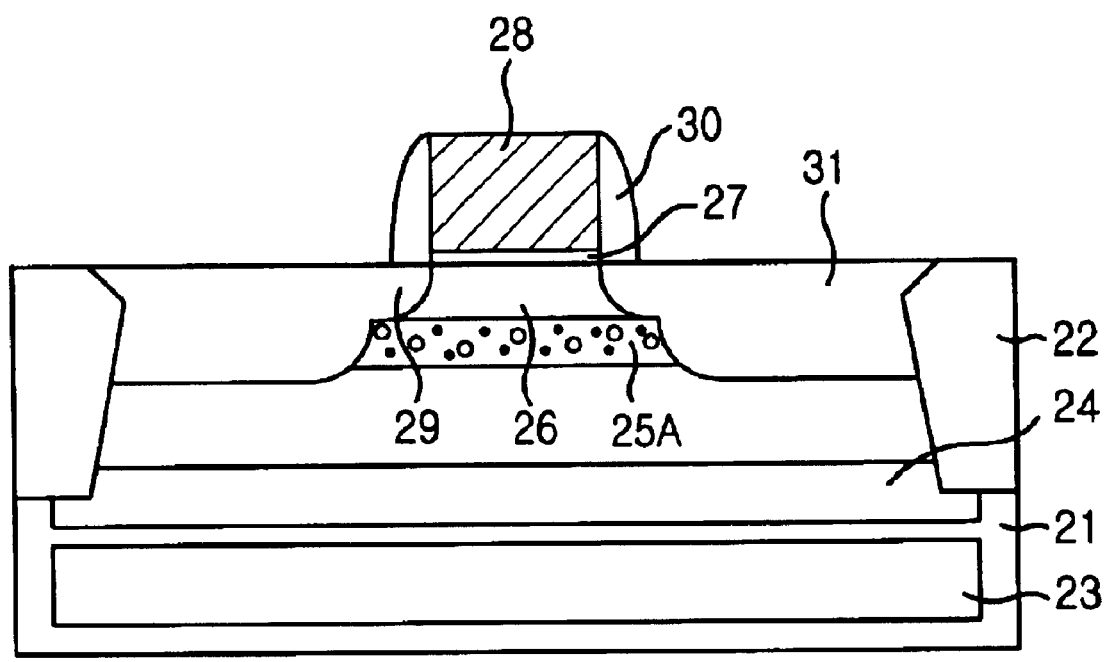
FIG. 3 is a cross-sectional view of a p-channel metal-oxide-semiconductor filed effect transistor (pMOSFET) having an ultra shallow super-steep-retrograde epi-channel in accordance with a first preferred embodiment of the present invention.

FIG. 3 is a cross-sectional view of a p-channel metal-oxide-semiconductor field effect transistor (pMOSFET) having an ultra shallow super-steep-retrograde epi-channel in accordance with a first preferred embodiment of the present invention.

As shown, a gate insulating layer 27 and a gate electrode 28 are formed on a semiconductor substrate 21 in which an n-type well 23 and an n-type field punchthrough-stop layer 24 are formed. An epi-channel including a silicon epi-layer 26 and an n-type p-channel doping layer 25A is formed in the semiconductor substrate beneath the gate insulating layer 27. Afterwards, a highly concentrated p-type source/drain extension (SDE) region 29 is formed at both lateral sides of the epi-channel, and a highly concentrated p-type source/drain (SD) region 31 electrically connected to the p-type SDE region 29 is subsequently formed thereafter. A spacer 30 is formed at both lateral sides of the gate electrode 28.

In FIG. 3, the n-type p-channel doping layer 25A is a channel doping layer proceeded with a dual doping of a dopant having a low diffusion rate (refer to 'o' in FIG. 3) and another dopant having a high diffusion rate (refer to '574 ' in FIG. 3). As$^+$ or Sb$^+$ is an example of the dopant having the low diffusion rate, while P$^+$ is an example of the dopant having the high diffusion rate. The diffusion rate of P$^+$ is relatively higher than that of As$^+$ or Sb$^+$.

As described above, the pMOSFET of the present invention includes the n-type p-channel doping layer 25A with the dual doping and the silicon epi-layer 26 formed on the n-type p-channel doping layer 25A, thereby maintaining a high concentration of the channel doping layer and simultaneously controlling the dopant concentration of the epi-channel.

FIGS. 4A to 4G are cross-sectional views showing each step for fabricating the pMOSFET of FIG. 3.

Figure 4A:
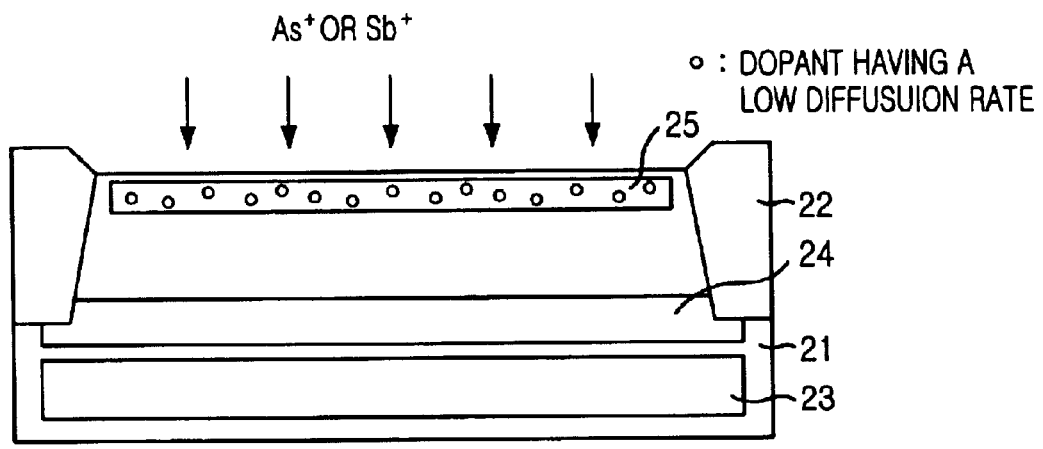
FIGS. 4A to 4G are cross-sectional views showing a process for fabricating the pMOSFET of FIG. 3.

Referring to FIG. 4A, a field oxide layer 22 for isolating devices is formed in a predetermined portion of a semiconductor substrate 21 through a shallow trench isolation (STI) or a local oxidation of silicon (LOCOS) process. Then, a deep n-type well 23 is formed by ion-implanting an n-type dopant onto the semiconductor substrate 21, and an n-type field stop layer 24 shallower than the n-type well 23 is formed by continuously ion-implanting the n-type dopant. Herein, P$^+$ is the n-type dopant for forming the n-type well 23 and the n-type field stop layer 24.

Next, a further ion implantation process is proceeded to form an n-type p-channel doping layer 25. The dopant having the low diffusion rate ('o') is firstly ion-implanted by using either As+ or Sb+.

Figure 4B:
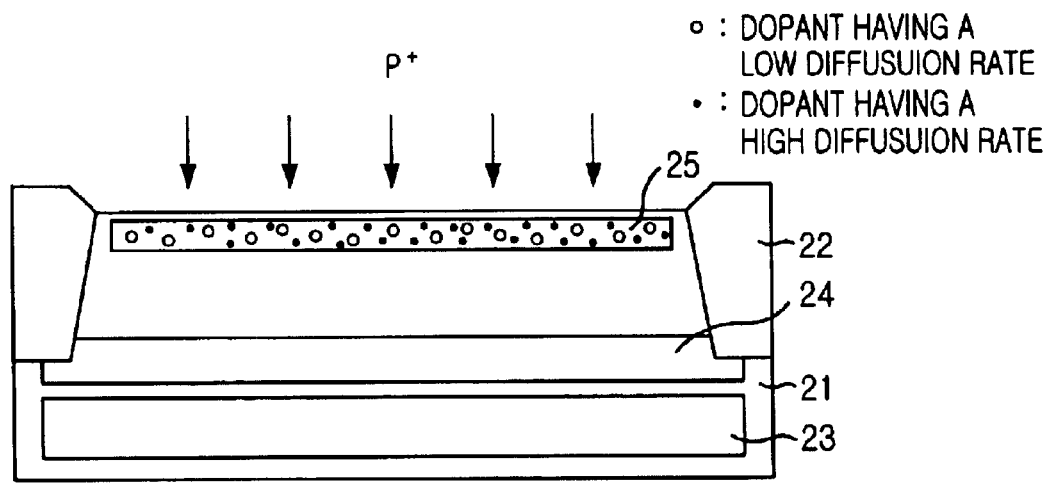

With reference to FIG. 4B, a second ion implantation process is proceeded to form the n-type p-channel doping layer 25. The dopant having the high diffusion rate ('●') is used in the second ion implantation process. At this time, P$^+$ is used for the dopant having the high diffusion rate, and the diffusion rate of the P$^+$ is relatively higher than that of the As$^+$ or Sb$^+$.

Eventually, the n-type p-channel doping layer 25 is dually doped with the dopant ('o') having the low diffusion rate and the dopant having the high diffusion rate ('●') and formed to a thickness of about 10 nm to about 50 nm from a surface of the semiconductor substrate 21.

Figure 4C:
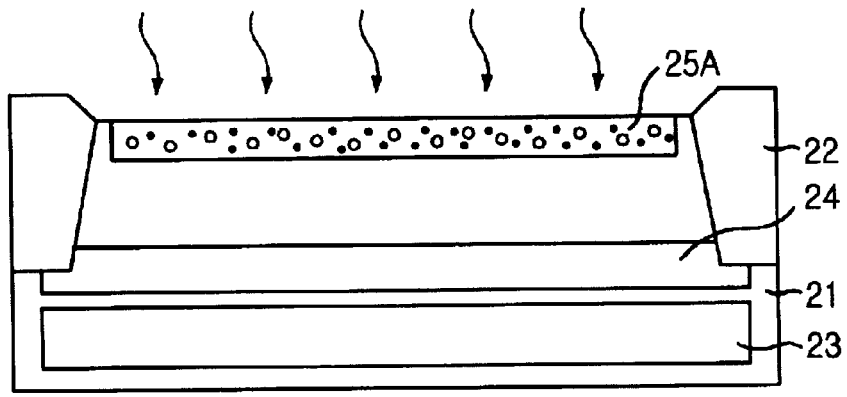

Referring to FIG. 4C, a recovery annealing is performed to recover crystal defects occurring at a surface of the semiconductor substrate 21 due to ion bombardments during the ion implantation for forming the n-type p-channel doping layer 25 and to make the dopants ion-implanted into the n-type p-channel doping layer 25 form stable bonds with closely disposed silicon atoms within crystals.

A rapid thermal annealing (RTA) or a spike rapid thermal annealing (SRTA) is performed as the recovery annealing at a temperature below about 1414° C., a melting point of silicon in order to suppress diffusions of the ion-implanted dopants.

Herein, the SRTA increases a room temperature to a targeted one within a short time and immediately decreases the targeted temperature to the room temperature. Herein, the recovery annealing has a ramping rate above about 150° C. per second and a delayed time below about 1 second.

Preferably, the RTA or SRTA is performed at a temperature being lower than the melting point of about 1414° C. and still allowing the recovery of the crystal defects. For instance, the RTA is proceeded at a temperature ranging from about 600° C. to about 1050° C., and the SRTA is performed at a temperature ranging from about 600° C. to about 1150° C.

In the end, by employing the recovery annealing, the n-type p-channel doping layer 25 is reformed as a layer being removed of the crystal defects and having stable bonds formed between the dopants ion-implanted into the n-type p-channel doping layer 25 and the silicon atoms of the semiconductor substrate 21. That is, the n-type p-channel doping layer 25 is activated as a chemically stabilized n-type p-channel doping layer 25A through the recovery annealing.

Figure 4D:
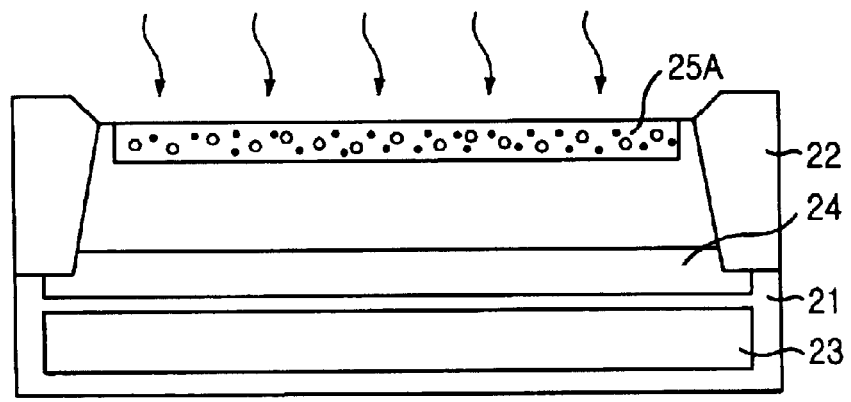

Referring to FIG. 4D, a surface treatment process is proceeded at an atmosphere of hydrogen to remove a native oxide layer (not shown) formed on the n-type p-channel doping layer 25A after the recovery annealing. At this time, hydrogen ($H_2$) reacts with the native oxide layer ($SiO_2$) and is evaporated as $H_2O$. As a result of this reaction, the native oxide layer is removed. During the surface treatment with hydrogen, it is preferable to maintain a temperature in a range from about 600° C. to about 950° C. in order to prevent diffusions of the dopants existing in the n-type p-channel doping layer 25A.

Figure 4E:
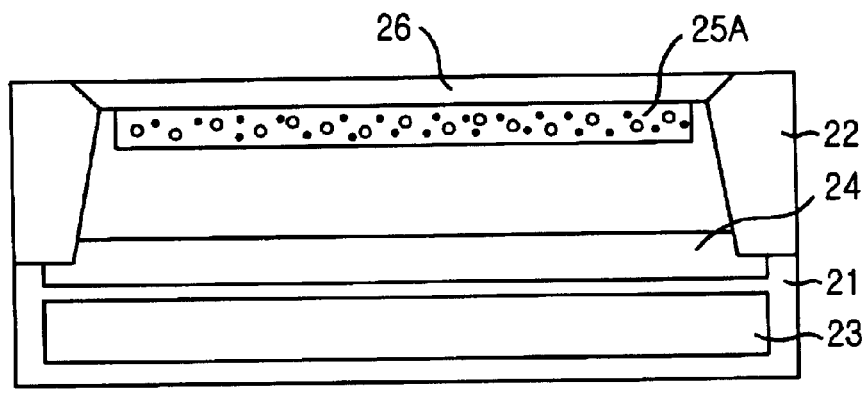

With reference to FIG. 4E, a silicon epi-layer 26 is grown on the semiconductor substrate 21 without the native oxide layer, preferably, on the n-type p-channel doping layer 25A through a selective epitaxial growth (SEG) technique. At this time, the silicon epi-layer 26 is grown to a thickness ranging from about 5 nm to about 30 nm.

Since the n-type p-channel doping layer 25 is activated to the chemically stable and shallow n-type p-channel doping layer 25A through the recovery annealing, it is possible to form a super-steep-retrograde (SSR) epi-channel structure minimized with dopant loses and redistributions during the surface treatment with hydrogen and the SEG of the silicon epi-layer 26.

Figure 4F:
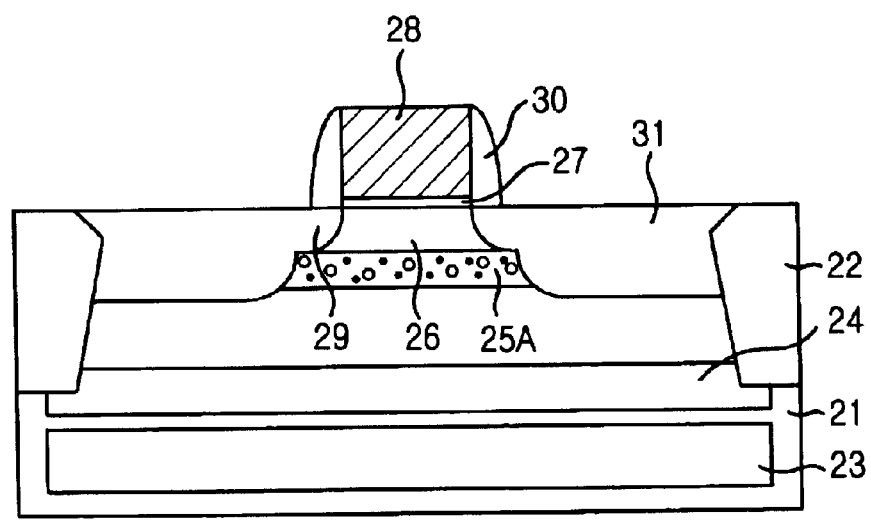

Referring to FIG. 4F, a gate insulating layer 27 is formed on the SSR epi-channel structure including the n-type p-channel doping layer 25A and the silicon epi-layer 26 at a temperature ranging from about 650° C. to 750° C. At this time, the reason for forming the gate insulating layer at a low temperature is to suppress the redistributions and diffusions of the dopants ion-implanted into the n-type p-channel doping layer 25A.

The gate insulating layer 27 uses a low temperature oxide (LTO) layer formed at a low temperature, a silicon oxynitride layer, a high dielectric layer or a stacked layer of an oxide layer and a high dielectric layer to achieve the aforementioned effects. Since a low thermal process is performed when forming the gate insulating layer 27, it is possible to maintain the SSR doping profile by suppressing the redistributions and diffusions of the dopants within the n-type p-channel doping layer 25A.

For example, a silicon thermal oxide layer, which is a LTO layer, is formed at a temperature ranging from about 650° C. to about 750° C., and the silicon oxynitride layer is formed by firstly forming a silicon thermal oxide layer at a temperature ranging from about 650° C. to about 750° C. and subsequently treating it with nitrogen plasma or ammonia plasma. The high dielectric layer is formed through a deposition of a layer using a typical material for the dielectric layer at a temperature ranging from about 300° C. to about 650° C. and a subsequent furnace annealing at a temperature of about 400° C. to about 700° C. or through a deposition at a temperature ranging from about 300° C. to about 650° C. and a subsequent rapid annealing at a temperature of about 600° C. to about 800° C. Also, in case of using the high dielectric layer, a maximum temperature for an additional thermal process for improving properties of the high dielectric layer is set to be in a range from about 300° C. to about 700° C.

Next, a conductive layer for use in the gate electrode is deposited on the gate insulating layer 27 and patterned to form a gate electrode 28. Herein, the conductive layer for forming the gate electrode 28 can be a stack layer of a polysilicon layer and a metal layer or a stack layer of a polysilicon layer and a silicide layer.

Then, a p-type dopant is highly ion-implanted with low energy by using an additional photosensitive mask (not shown) and the gate electrode 28 as an ion implantation mask so that a p-type SDE region 29 is formed. At this time, the p-type dopant for forming the p-type SDE region 29 can be boron (B), boron difluoride ($BF_2$) or ions of boron-containing compound.

Next, an insulating layer for use in a spacer is deposited on the entire structure of the gate electrode 28. Then, an etch-back process is applied to the insulating layer so as to form a spacer 30 contacting to lateral sides of the gate electrode 28. Herein, the spacer 30 uses a nitride layer, an oxide layer or combination of a nitride layer and an oxide layer.

Subsequently, the p-type dopant such as boron or boron-containing compound is highly ion-implanted by using an additional photosensitive mask, the gate electrode 28 and the spacer 30 as an ion implantation mask so as to form a p-type SD region 31 electrically connected to the P-type SDE region 29. At this time, an ion implantation depth of the p-type SD region 31 is deeper than that of the P-type SDE region 29.

Figure 4G:
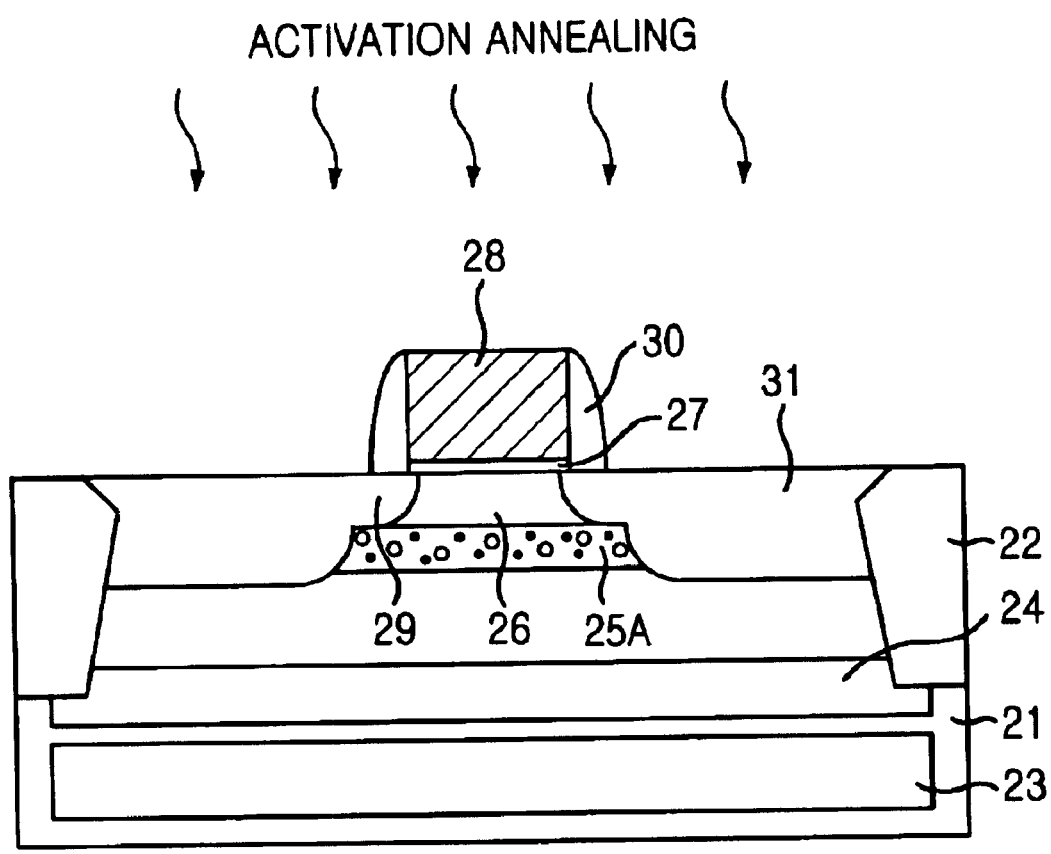

With reference to FIG. 4G, an activation annealing process is carried out to electrically activate the dopants within the p-type SD region 31 and the p-type SDE region 29. Particularly, the activation annealing process is performed at a temperature suppressing diffusions of the n-type p-channel doping layer 25A and deepening of a junction depth between the p-type SD region 31 and the p-type SDE region 29.

Preferably, the activation annealing process is selected any one among a RTA performed at a temperature ranging from about 600° C. to about 1000° C., a furnace annealing at a temperature ranging from about 300° C. to about 750° C., a SRTA at a temperature ranging from about 600° C. to about 1100° C. or combination of any two of the above annealing processes.

As well known, the p-type SDE region 29 is overlapped with an edge part of the gate electrode 28 due to the activation annealing, and the p-type SD region 31 is overlapped with an edge part of the spacer 30.

Meanwhile, in case that the gate electrode 28 and the p-type SD region 31 formation is proceeded through a low temperature process, it is possible to maintain the SSR epi-channel structure suppressing the dopant diffusions.

In the preferred embodiment described above, the n-type p-channel doping layer 25A functions simultaneously as a punch stop layer suppressing a short channel effect. It is also possible to reduce junction capacitance with respect to an np junction and junction leakage currents by setting a maximum doping depth of the n-type p-channel doping layer 25A to be lower than a junction depth of the p-type SD region 31.

Figure 5:
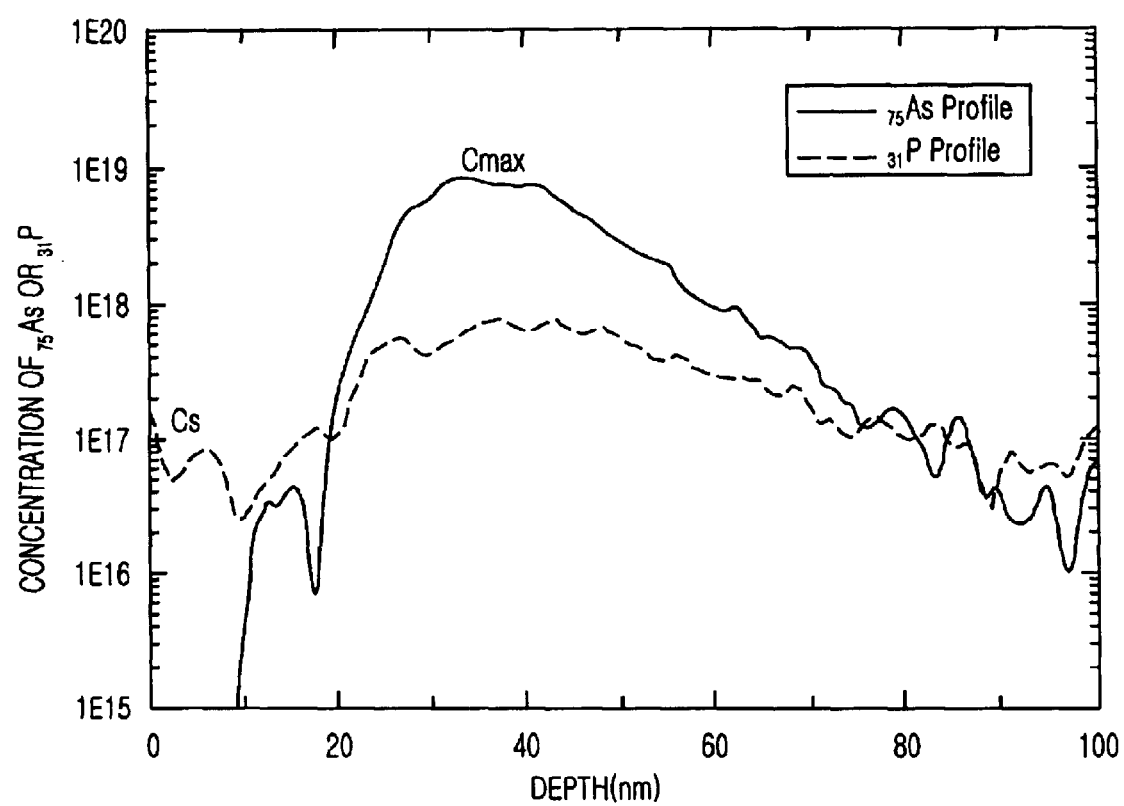
FIG. 5 is a graph showing a doping profile of a channel doping layer proceeded with a dual doping of As and P.

FIG. 5 is a graph showing a doping profile of a channel doping layer dually doped with As and P.

As shown, there exists more than 50 times of a concentration difference between a Cmax of a channel doping layer and a Cs of a silicon surface. Herein, the Cmax of the channel doping layer is about $1.0 \times 10^{19}$ atoms/cm$^3$. That is, it is possible to form easily the channel doping layer having a high concentration of about $1.0 \times 10^{19}$ atoms/cm$^3$, which is the Cmax of an epi-channel required for a device having a gate length about 30 nm. Herein, the aforementioned Cmax is the concentration wherein the short channel effect of an ultra short channel pMOSFET simultaneously functioning as a punch stop layer and having a gate length up to about 30 nm is suppressed.

Since the channel doping layer is formed through a dual doping by using dopants having a low diffusion rate and a high diffusion rate, it is possible to realize the Cmax of the epi-channel required for a device of which gate length is about 30 nm without forming a HALO doping layer additionally.

Figure 6:
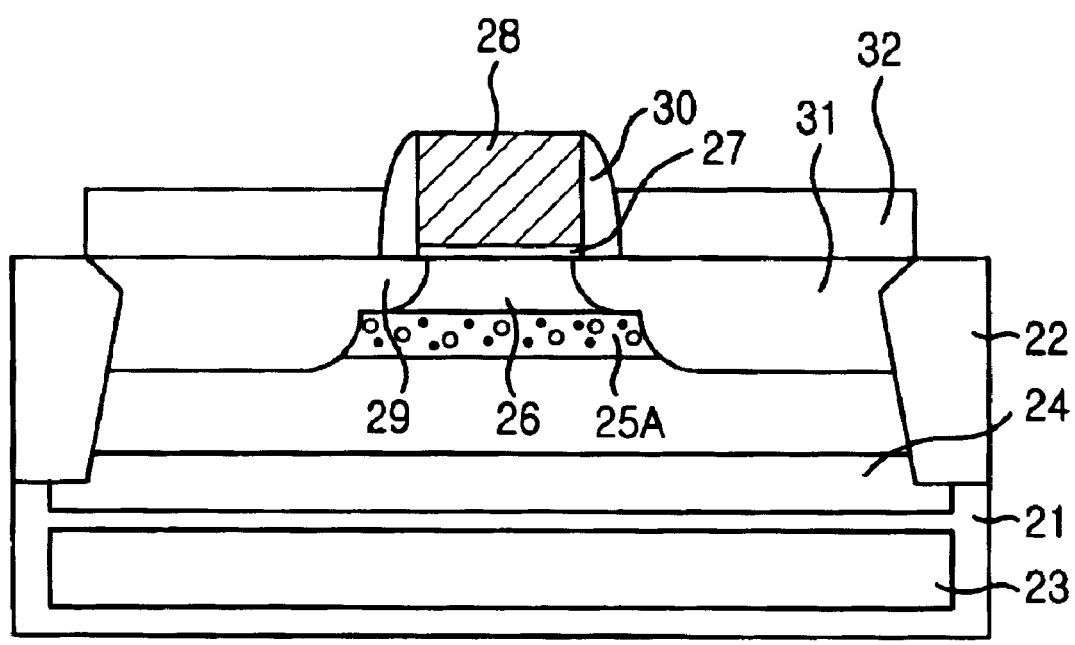
FIG. 6 is a cross-sectional view showing a pMOSFET having an ultra shallow super-steep-retrograde epi-channel in accordance with a second preferred embodiment of the present invention.

FIG. 6 is a cross-sectional view showing a pMOSFET structure in accordance with a second preferred embodiment of the present invention.

As shown, a gate insulating layer 27 and a gate electrode 28 are formed on a semiconductor substrate 21 providing an n-type well 23, an n-type field stop layer 24 and a field oxide layer 22. Then, an epi-channel including a silicon epi-layer 26 and an n-type p-channel doping layer 25A is formed in the semiconductor device 21 beneath the gate insulating layer 27. A highly concentrated p-type SDE region 29 is formed at both lateral sides of the epi-channel, and a highly concentrated p-type SD region 31 electrically connected to the p-type SDE region 29 is formed thereafter. A spacer 30 is formed at both lateral sides of the gate electrode 28.

Unlike to the pMOSFET shown in FIG. 3, the pMOSFET of FIG. 6 includes an elevated p-type SD region 32 formed by growing an additional silicon epi-layer on the p-type SDE region 31.

Figure 7:
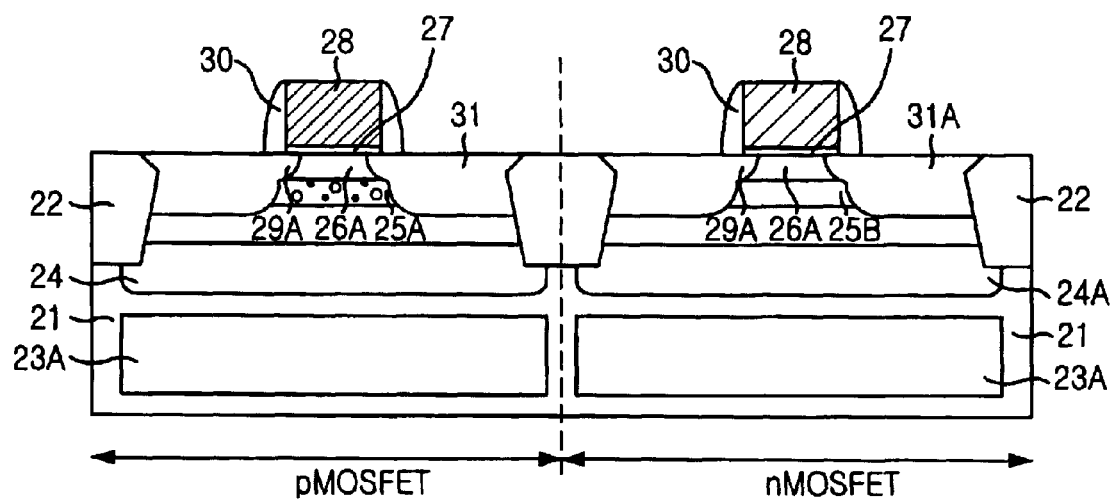
FIG. 7 is a cross-sectional view showing a CMOSFET structure in accordance with a third preferred embodiment of the present invention.

FIG. 7 is a cross-sectional view showing a CMOSFET structure in accordance with a third preferred embodiment of the present invention.

As shown, the pMOSFET is identical to the pMOSFETs shown in FIGS. 3 and 6. In an nMOSFET, a gate insulating layer 27 and a gate electrode 28 are formed on a semiconductor substrate 21 in which a p-type well 23A and a p-type field stop layer 24A are formed. Then, an epi-channel including a silicon epi-layer 26A and a p-type n-channel doping layer 25B is formed in the semiconductor substrate 21 beneath the gate insulating layer 27. Afterwards, a highly concentrated n-type SDE 29A is formed at both lateral sides of the epi-channel, and a highly concentrated n-type SD region 31A electrically connected to the n-type SDE region 29A is formed. A spacer 30 is formed at both lateral sides of the gate electrode 28.

The nMOSFET illustrated in FIG. 7, the p-type well 23A and the p-type field stop layer 24A are formed through an ion implantation of B. Meanwhile, the p-type n-channel doping layer 25B is formed to a thickness of about 10 nm to about 50 nm from a surface of the semiconductor substrate 21 by ion-implanting B, BF$_2$ ions or ions of B-containing compound. The n-type SDE 29A and the n-type SD region 31A are formed by ion-implanting As or P.

Also, the gate insulating layer 27, the gate electrode 28 and the spacer 30 are formed through the use of the identical processes employed for forming the pMOSFET. The ion implantation processes for forming the p-type well 23A, the p-type field stop layer 24A, the p-type channel doping layer 25B, the n-type SDE region 29A and the n-type SD region 31A are separately proceeded.

Figure 8:
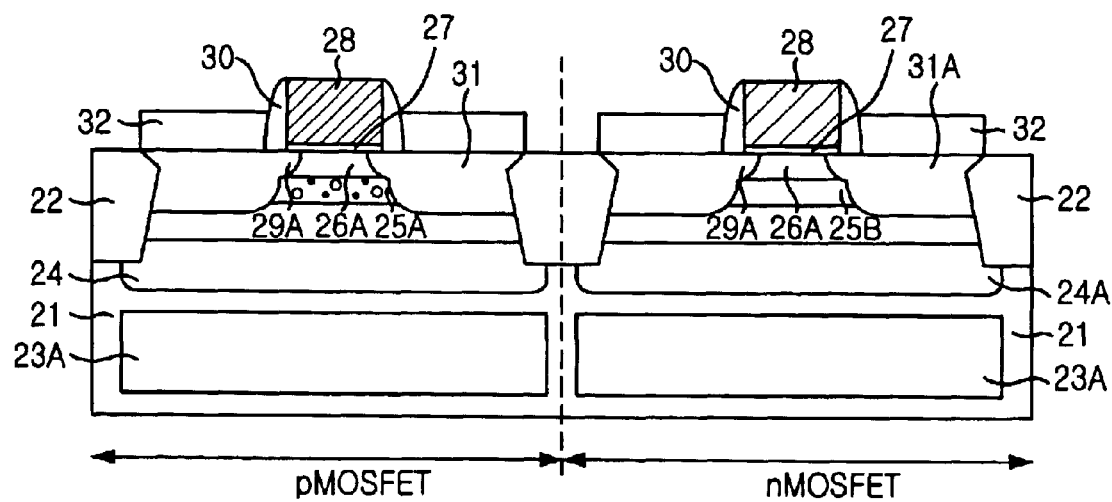
FIG. 8 is a cross-sectional view showing a CMOSFET structure in accordance with a forth preferred embodiment of the present invention.

FIG. 8 is a cross-sectional view showing a CMOSFET structure in accordance with a forth preferred embodiment of the present invention.

As shown, a pMOSFET of the CMOSFET is identical to the pMOSFET of FIG. 6. That is, an elevated p-type SD region 32 is formed by growing an additional silicon epi-layer on a p-type SD region 31. Also, in an nMOSFET, a gate insulating layer 27 and a gate electrode 28 are formed on a semiconductor substrate 21 providing a p-type well 23A and a p-type field stop layer 24A. An epi-channel including the silicon epi-layer 26A and a p-type n-channel doping layer 25B is formed in the semiconductor substrate 21 beneath the gate insulating layer 27. Then, a highly concentrated n-type SDE region 29A is formed at both lateral sides of the epi-channel, and a highly concentrated n-type SD region 31A electrically connected to the n-type SDE region 29A is formed thereafter. A spacer 30 is formed at both lateral sides of the gate electrode 28. Similar to the pMOSFET, an elevated n-type SD region 32 is formed by growing an additional silicon epi-layer formed on the n-type SD region 31A.

In the nMOSFET shown in FIG. 8, the p-type well 23A and the p-type field stop layer 24A are formed through an ion implantation of B. Meanwhile, the p-type n-channel doping layer 25B is formed to a thickness of about 10 nm to about 50 nm from a surface of the semiconductor substrate 21 by ion-implanting B, BF$_2$ ions or ions of B-containing compound. The n-type SDE region 29A and the n-type SD region 31A are formed by ion-implanting AS or P.

Additionally, the gate insulating layer 27, the gate electrode 28, and the spacer 30 are formed through the same process for forming the nMOSFET. In the meantime, the ion implantation process for forming the p-type well 23A, the p-type field stop layer 24A, the p-type n-channel doping layer 25B, the n-type SDE region 29A and the n-type SD region 31A are proceeded separately from the ion implantation process for the pMOSFET.

Similar to the pMOSFET of FIG. 3, the pMOSFETs illustrated in FIGS. 6 to 8 include the n-type p-channel doping layer 25A formed through the dual doping of the dopant having the low diffusion rate (refer to 'o' in FIGS. 6 to 8) and the dopant having the high diffusion rate (refer to '●' in FIGS. 6 to 8). The dopant having the low diffusion rate is As$^+$ or Sb$^+$, and the dopant having the high diffusion rate is P$^+$. The diffusion rate of the P$^+$ is relatively higher than that of the As$^+$ or Sb$^+$.

Accordingly, it is possible for the pMOSFETs shown in FIGS. 6 to 8 to obtain the same result shown in FIG. 5.

The present invention provides an advantage of realizing an ultra shallow SSR epi-channel structure having a channel depth below 20 nm by forming the channel doping layer having the Cmax above $1 \times 10^{19}$ atoms/cm$^3$ obtained through the dual doping and having a maximum concentration difference with respect to a surface concentration more than 100 times. As a result of this realization, it is possible to fabricate an ultra short channel pMOSFET of which gate length is about 30 nm.

Also, it is possible to fabricate a device having a gate length below about 30 nm since the present invention stratifies simultaneously an effect of suppressing fluctuations of the threshold voltage due to a random dopant effect and an effect of suppressing the short channel effect existing in a gate length below 30 nm.

The present invention provides another effect on a decrease in a junction capacitance of a device having a gate length about 30 nm due to the realization of the ultra shallow SSR channel structure having a narrow delta doping profile.

It is further possible to improve surface mobility and driving current characteristics since the dopant concentration of the epi-channel surface can be lowered up to above about 1/100 of the maximum concentration of the channel doping layer.

Moreover, the ultra shallow SSR epi-channel structure can be easily realized, thereby easily realizing a low voltage consuming device having a low threshold voltage and a low power dissipation device.

While the present invention has been described with respect to certain preferred embodiments, it will be apparent to those skilled in the art that various changes and modifications may be made without departing from the scope of the invention as defined in the following claims.

What is claimed is:

1. A method for forming an epi-channel of a p-channel metal-oxide-semiconductor (pMOS) device, comprising the steps of:

forming a channel doping layer beneath a surface of a semiconductor substrate through a dual doping of dopants having different diffusion rates;

performing an annealing process for activating the dopants ion-implanted into the channel doping layer;

performing a surface treatment for removing a native oxide layer formed on a surface of the channel doping layer; and growing a silicon epi-layer on the channel doping layer through a selective epitaxial growth.

2. The method as recited in claim 1, wherein the step of forming the channel doping layer includes further the steps of:

ion-implanting a first n-type dopant; and ion-implanting a second n-type dopant having a diffusion rate higher than that of the first n-type dopant.

3. The method as recited in claim 2, wherein the first n-type dopant is As or Sb and the second n-type dopant is P.

4. The method as recited in claim 1, wherein the step of performing the annealing process is selected from either a rapid thermal annealing (RTA) or a spike RTA (SRTA).

5. The method as recited in claim 4, wherein the RTA is proceeded at a temperature ranging from about 600° C. to about 1050° C., and the SRTA is performed at a temperature ranging from about 600° C. to about 1150° C.

6. The method as recited in claim 1, wherein the surface treatment is performed at an atmosphere of hydrogen.

7. A method for fabricating a pMOS device, comprising the steps of:

forming an n-type channel doping layer beneath a surface of a semiconductor substrate through a dual doping of dopants having different diffusion rates;

performing a surface treatment for removing a native oxide layer formed on a surface of the n-type channel doping layer;

growing a silicon epi-layer on the n-type channel doping layer through a selective epitaxial growth;

forming sequentially a gate insulating layer and a gate electrode on a predetermined region of the silicon epi-layer through deposition and patterning processes;

forming a highly concentrated p-type source/drain extension region in a predetermined portion of the semiconductor substrate beneath lateral sides of the gate electrode;

forming a spacer at lateral sides of the gate electrode; and forming a highly concentrated p-type source/drain region electrically connected to the source/drain extension region.

8. The method as recited in claim 7, wherein the step of forming the n-type channel doping layer includes further the steps of:

ion-implanting a first n-type dopant; and ion-implanting a second n-type dopant having a diffusion rate higher than that of the first n-type dopant.

9. The method as recited in claim 8, wherein the first n-type dopant is As or Sb, and the second n-type dopant is P.

10. The method as recited in claim 7, wherein the annealing process is selected any one from a rapid thermal process (RTA) and a spike RTA (SRTA).

11. The method as recited in claim 10, wherein the RTA is proceeded at a temperature ranging from about 600° C. to about 1050° C., and the SRTA is performed at a temperature ranging from about 600° C. to about 1150° C.

12. The method as recited in claim 7, wherein the surface treatment is carried out at an atmosphere of hydrogen.

13. The method as recited in claim 7, further comprising the step of forming an elevated source/drain region on the p-type source/drain region through a selective epitaxial growth.

14. A pMOS device, comprising:

a semiconductor substrate;

a channel doping layer being formed in a surface of the semiconductor substrate and being dually doped with dopants having different diffusion rates;

a silicon epi-layer being formed on the channel doping layer, whereby constructing an epi-channel along with the channel doping layer;

a gate insulating layer formed on the silicon epi-layer;

a gate electrode formed on the gate insulating layer;

a source/drain extension region highly concentrated and formed in the semiconductor substrate of both lateral sides of the epi-channel; and a source/drain region electrically connected to the source/drain extension region and deeper than the source/drain region.

15. The pMOS device as recited in claim 14, the channel doping layer is dually doped with the first n-type dopant and the second n-type dopant having a higher diffusion rate than that of the first n-type dopant.

16. The pMOS device as recited in claim 15, wherein the first n-type dopant is As or Sb, and the second n-type dopant is P.

17. The pMOS device as recited in claim 14, wherein the channel doping layer is formed to have a thickness ranging from about 10 nm to about 50 nm.

18. The pMOS device as recited in claim 14, the silicon epi-layer is formed to have a thickness ranging from about 5 nm to about 30 nm.

* * * * *